United States Patent
Imamura

(10) Patent No.: US 11,799,258 B2
(45) Date of Patent: Oct. 24, 2023

(54) ROTARY ELECTRONIC COMPONENT AS SLIP RING

(71) Applicant: TSUBAME RADIO CO., LTD, Maebashi (JP)

(72) Inventor: Masao Imamura, Maebashi (JP)

(73) Assignee: TSUBAME RADIO CO., LTD

( * ) Notice: Subject to any disclaimer, the term of this patent is extended or adjusted under 35 U.S.C. 154(b) by 0 days.

(21) Appl. No.: 17/920,023

(22) PCT Filed: Sep. 17, 2021

(86) PCT No.: PCT/JP2021/034309
§ 371 (c)(1),
(2) Date: Oct. 20, 2022

(87) PCT Pub. No.: WO2022/107436
PCT Pub. Date: May 27, 2022

(65) Prior Publication Data
US 2023/0187886 A1    Jun. 15, 2023

(30) Foreign Application Priority Data
Nov. 20, 2020 (JP) ................. 2020-192956

(51) Int. Cl.
*H01R 39/12* (2006.01)
*H01R 39/22* (2006.01)
*H01R 39/26* (2006.01)

(52) U.S. Cl.
CPC ............. *H01R 39/22* (2013.01); *H01R 39/12* (2013.01); *H01R 39/26* (2013.01)

(58) Field of Classification Search
CPC ......... H01R 39/22; H01R 39/12; H01R 39/26
See application file for complete search history.

(56) References Cited

U.S. PATENT DOCUMENTS 3,607,159 A * 9/1971 Haywood ............... B24D 3/32
                                                     51/299
2012/0213544 A1    8/2012 Ooyoshi

FOREIGN PATENT DOCUMENTS

| JP | H04-72598 U | 6/1992 |
|----|-------------|--------|
| JP | H06-84572 A | 3/1994 |

(Continued)

OTHER PUBLICATIONS

JP2003116249A English translation (Year: 2023).*

(Continued)

*Primary Examiner* — Christopher M Koehler
*Assistant Examiner* — Viswanathan Subramanian
(74) *Attorney, Agent, or Firm* — Yokoi & Co., U.S.A.; Toshiyuki Yokoi

(57) ABSTRACT

A rotary electronic component capable of reducing an abrasion and a metal fatigue of a slider and extending a rotation life time compared to the conventional technology. A rotary electronic component is provided with a buffer member between a sliding portion of a slider and a rotor. Thus, the sliding portion is energized toward the annular electrode with a proper elastic force and the sliding portion is held. Because of this, vibration of the sliding portion is suppressed and metal fatigue of the slider can be reduced. Furthermore, since the lubricant is impregnated into the buffer member and a part of the buffer member is in contact with the annular electrode, the lubricant can be applied on the annular electrode. Consequently, the sliding portion slides smoothly and the abrasion of the contact portion can be further reduced. In addition, since the buffer member functions to wipe the surface of the annular electrode, foreign substances such as dust on the annular electrode are collected. Thus, harmful effect to the contact portion by the foreign substances can be prevented. By the above described configurations, the rotary (Continued)

electronic component of the present invention can obtain the extended life time and high operation reliability.

4 Claims, 4 Drawing Sheets

(56) References Cited

FOREIGN PATENT DOCUMENTS

| | | | |
|---|---|---|---|
| JP | 2003-5582 A | | 1/2003 |
| JP | 2003005582 A | * | 1/2003 |
| JP | 2003116249 A | * | 4/2003 |
| JP | 3950635 B2 | * | 8/2007 |
| JP | 2012-173346 A | | 9/2012 |
| JP | 2015-162314 A | | 9/2015 |

OTHER PUBLICATIONS

JP2003005582A English translation (Year: 2023).*
JP3950635B2 English translation (Year: 2023).*
International Search Report for PCT/JP2021/034309 dated Nov. 22, 2021.

* cited by examiner

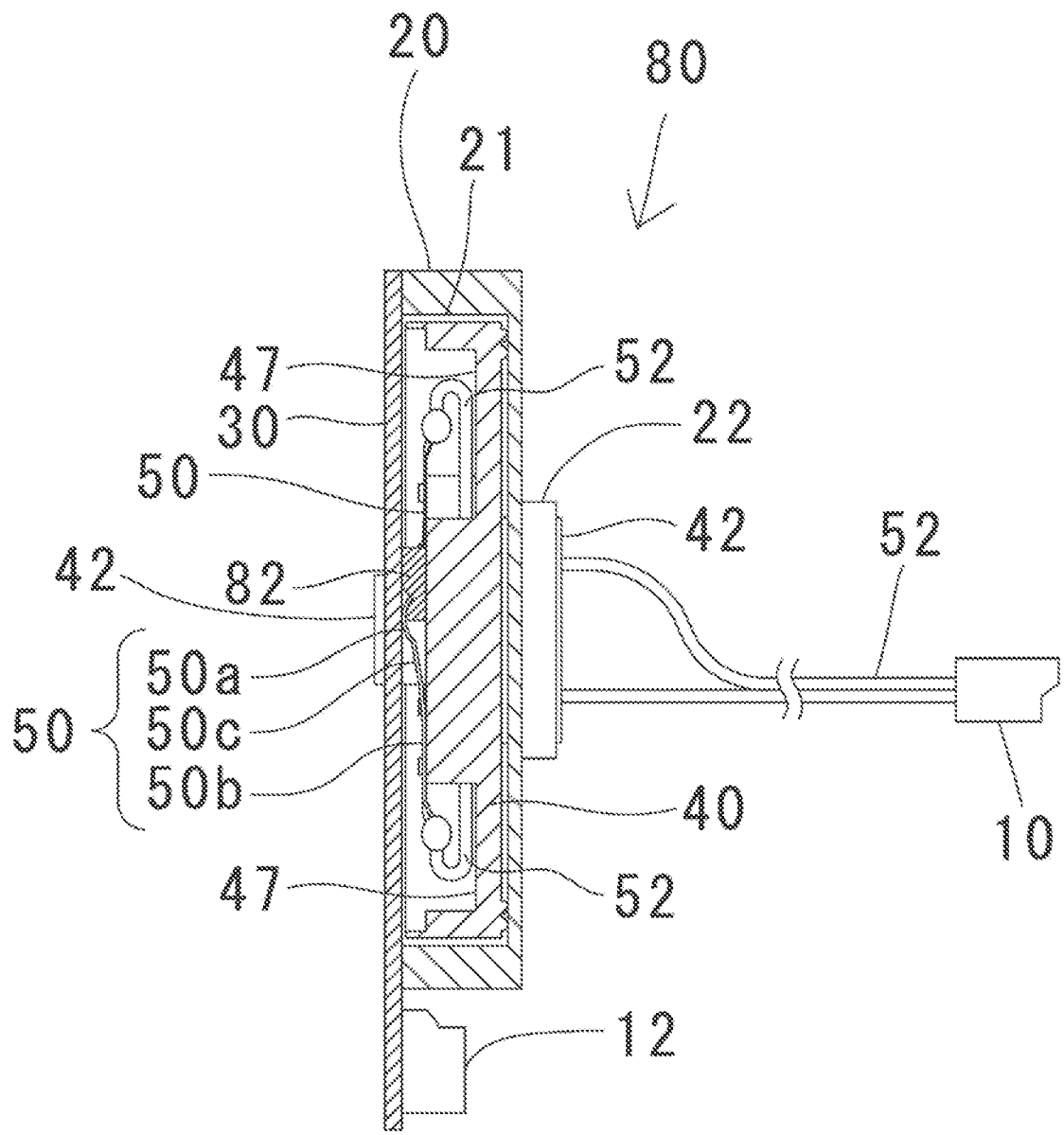

ROTARY ELECTRONIC COMPONENT AS SLIP RING

TECHNICAL FIELD

The present invention relates to a rotary electronic component capable of extending a rotation life time by reducing an abrasion and a metal fatigue of a slider.

BACKGROUND ART

A rotary electronic component such as a variable resistor and an encoder which is rotated while keeping an electric continuity by a contact of a rotor is conventionally known. In the above described rotary electronic component, a slip ring has an important role for supplying a power and transmitting signals between a stator section and a rotor section in an industrial robot, a carrying device, a game machine, a universal head of a monitor camera and the like. In some cases, a rotational frequency is high and the rotation is always continued. Therefore, it is particularly required to reduce the abrasion and the metal fatigue of the slider and extend the rotation life time. As for the above described problem, the inventor of the present invention and other inventors made an invention of [Patent Document 1] below where a though hole is provided on an edge of an annular electrode to displace the through hole from a sliding track of the slider. Thus, metal fatigue caused by the abrasion and vibration due to the level difference of the through hole are reduced.

PRIOR ART DOCUMENTS

Patent Documents

Patent Document 1: Japanese Patent Publication No. 2015-162314

DISCLOSURE OF THE INVENTION

Problems to be Solved by the Invention

However, in recent years, the rotation life time is required to be extended to ten million revolutions although it was conventionally three million revolutions. In particular, further countermeasure is required for abrasion and metal fatigue of the slider.

The present invention is made considering the above described problem and aims for providing a rotary electronic component capable of reducing the abrasion and the metal fatigue of the slider and extending the rotation life time compared to the conventional technology.

Means for Solving the Problem

The present invention solves the above described problem by providing (1) a rotary electronic component, including: a rotor 40; a case portion 20 that rotatably houses the rotor 40; an electrode substrate 30 having an annular electrode 32 concentric to a rotation axis of the rotor 40 so that the annular electrode 32 faces the rotor 40; a slider 50 provided on the rotor 40 so as to be contacted and conducted with the annular electrode 32, wherein the slider 50 includes: a sliding portion 50a having an arc shape protruded toward the electrode substrate 30 so as to be contacted and conducted with the annular electrode 32; a fixing portion 50b fixed to the rotor 40; and a connection portion 50c connecting the sliding portion 50a with the fixing portion 50b, the connection portion 50c and the fixing portion 50b are curved toward the electrode substrate 30 in a predetermined angle, a buffer member 82 having a flexibility and a water absorbability is provided between the sliding portion 50a and the rotor 40, a contact area between the buffer member 82 and the sliding portion 50a is from a tip portion of the sliding portion 50a to an intermediate portion of the sliding portion 50a, the buffer member 82 is longer than the tip portion of the sliding portion 50a, and the buffer member 82 energizes the sliding portion 50a to the annular electrode 32 for suppressing a vibration of the slider 50.

The present invention solves the above described problem by providing (2) the rotary electronic component of (1), wherein the buffer member 82 is a material selected from a group consisting of a polyurethane, a polyvinyl alcohol and a polyolefin, an average pore diameter of the material is 20 µm to 50 µm, a porosity of the material is 70% to 90%, and an apparent density of the material is 0.15 g/cm$^3$ to 0.25 g/cm$^3$.

The present invention solves the above described problem by providing (3) the rotary electronic component of (1) or (2), wherein a lubricant is impregnated into the buffer member 82.

The present invention solves the above described problem by providing (4) the rotary electronic component of (3), wherein a part of the buffer member 82 is in contact with the annular electrode 32, and the buffer member 82 is configured to apply the lubricant on the annular electrode 32 and wipe the annular electrode 32.

Effects of the Invention

In the rotary electronic component of the present invention, since the buffer member is provided between the sliding portion of the slider and the rotor, the sliding portion is energized toward the annular electrode with a proper elastic force and the sliding portion is held. Consequently, the vibration of the sliding portion is suppressed and the metal fatigue of the slider can be reduced. Furthermore, since the lubricant is impregnated into the buffer member and a part of the buffer member is in contact with the annular electrode, the lubricant can be applied on the annular electrode. Consequently, the sliding portion slides smoothly and the abrasion of the contact portion can be further reduced. In addition, since the buffer member functions to wipe the surface of the annular electrode, foreign substances such as dust on the annular electrode are collected. Thus, harmful effect to the contact portion by the foreign substances can be prevented. By the above described configurations, the rotary electronic component of the present invention can obtain the extended life time and high operation reliability.

BRIEF DESCRIPTION OF THE DRAWINGS

FIG. 3 is a schematic X-X cross-sectional view of the slip ring of the present invention.

MODES FOR CARRYING OUT THE INVENTION

The embodiments of the rotary electronic component of the present invention will be explained based on the drawings. Although the explanation will be made using a slip ring 80 as an example of the rotary electronic component here, the present invention is not limited to the slip ring. The present invention can be applied to any kinds of rotary electronic components such as a variable resistor and an encoder including an annular electrode concentric to a rotation axis of the rotor and a slider contacted and conducted with the annular electrode.

Figure 1:
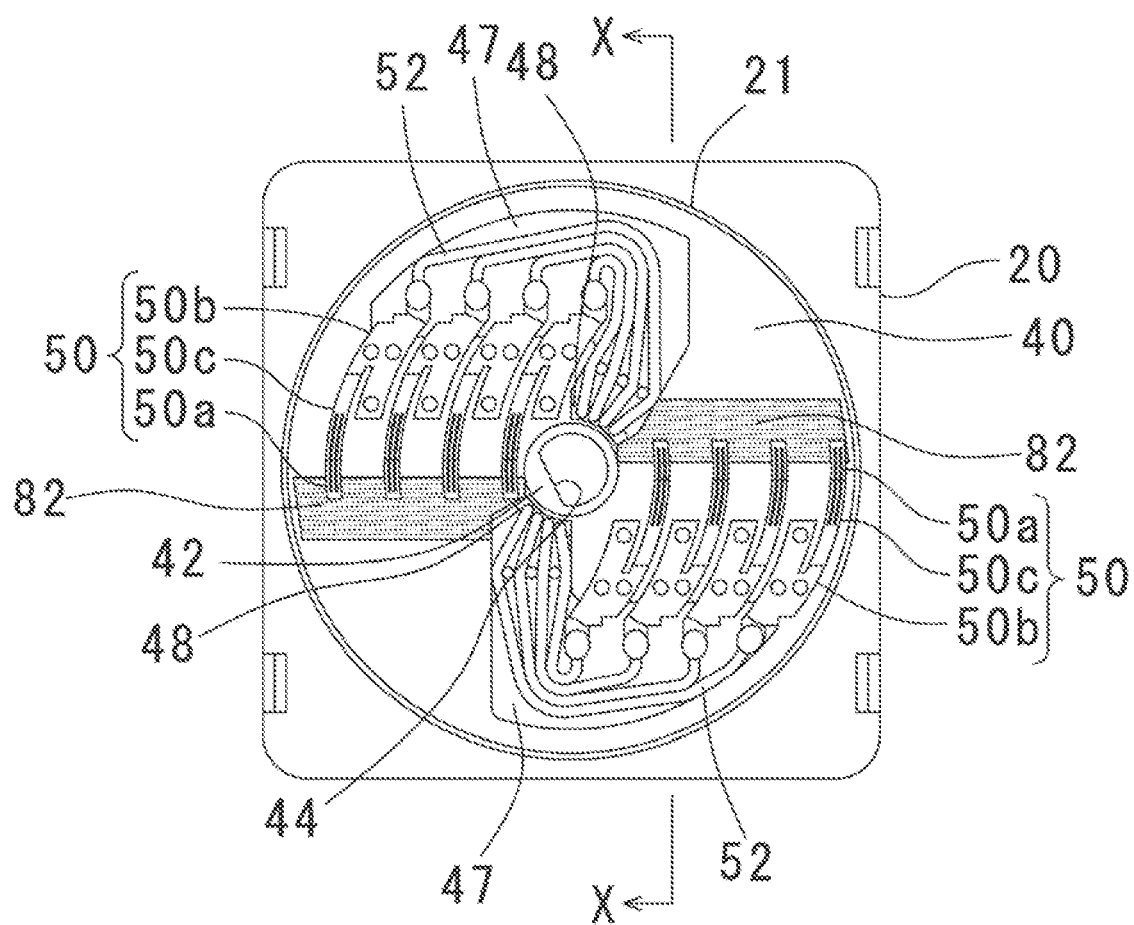
FIG. 1 is a drawing showing a rotor side of a slip ring of the present invention in a state that an electrode substrate is detached.
Figure 2A:
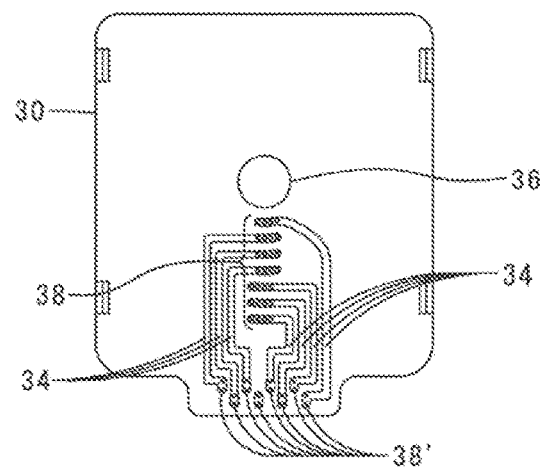
FIGS. 2A and 2B are drawings showing the electrode substrate of the slip ring of the present invention.
Figure 2B:
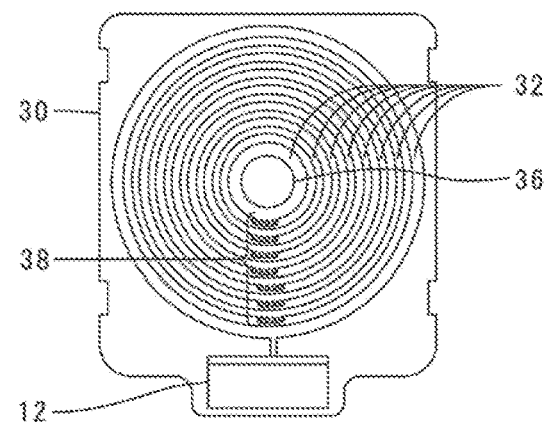
Figure 4:
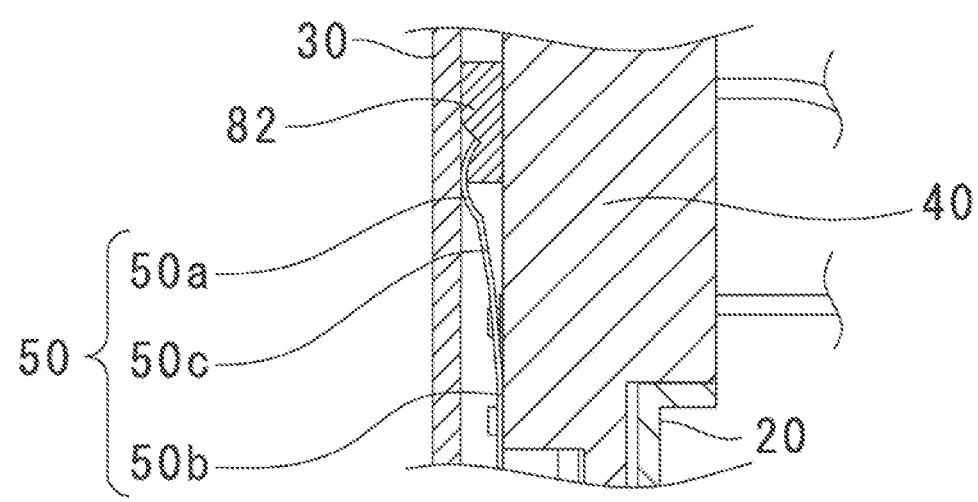
FIG. 4 is an enlarged view of a sliding portion of the slip ring of the present invention.

Here, FIG. 1 is a drawing showing a rotor 40 side of a slip ring 80 of the present invention in a state that an electrode substrate 30 is detached. FIGS. 2A and 2B are drawings showing an outer surface and an inner surface (surface having the annular electrode 32) of the electrode substrate 30. FIG. 3 is a schematic X-X cross-sectional view of the slip ring 80 in which the electrode substrate 30 is installed. FIG. 4 is an enlarged view of the sliding portion of the slip ring 80 to which the present invention is applied. Note that the slip ring 80 of the present invention shown here is an example for explaining the present invention. Thus, the number of poles, the structure of each component, the design, the wiring pattern and other configurations are not limited to this.

First, the conventional configuration of the slip ring 80 of the present invention will be explained. The slip ring 80 shown in FIG. 1 to FIG. 3 includes a rotor 40, a case portion 20 that rotatably houses the rotor 40, an electrode substrate 30 having an annular electrode 32 concentric to a rotation axis of the rotor 40, and a slider 50 installed in the rotor 40 so as to be contacted and conducted with the annular electrode 32 of the electrode substrate 30.

In addition, the case portion 20 forming the slip ring 80 is made, for example, of a synthetic resin formed by molding or the like. The case portion 20 includes a rotor housing portion 21 inside of the case portion 20. As shown in FIG. 3, the electrode substrate 30 is installed on one surface of the rotor housing portion 21, and the other surface functions as a rotor receiving member 22 having a smaller diameter than the rotor 40.

In addition, the rotor 40 is made, for example, of a synthetic resin formed by molding or the like. A shaft cylinder 42 protruded in both directions is formed on a center portion of the rotor 40 and a shaft hole 44 is formed in the shaft cylinder 42. The shaft cylinder 42 functions as a rotation axis of the rotor 40 and penetrates through the electrode substrate 30 so that at least the shaft hole 44 is exposed from the electrode substrate 30. In addition, the slider 50 is fixed to the rotor 40, a cable housing portion 47 is provided on a rear part of the slider 50, a cable 52 connected with the slider 50 is housed in the cable housing portion 47, and the cable 52 is inserted through a cable through-hole 48 formed on a periphery of the shaft cylinder 42 and connected with a connector 10 of the reverse side.

In addition, the slider 50 is formed of a thin metal plate having elasticity. The sliders 50 having the same number as the annular electrodes 32 are installed on the rotors 40. In addition, the slider 50 is formed mainly by: a sliding portion 50a having an arc shape so as to be contacted and conducted with the annular electrode 32; a fixing portion 50b fixed to the rotor 40; and a connection portion 50c connecting the sliding portion 50a with the fixing portion 50b. The connection portion 50c and the fixing portion 50b are curved in a predetermined angle. Any methods can be used for fixing the slider 50 to the rotor 40. It is preferred that a fixing protrusion of the rotor 40 side is inserted into a fixing hole formed on the fixing portion 50b and fixed by adhesion, heat caulking or the like. As a characteristic configuration of the slip ring 80 of the present invention, as shown in an enlarged view of FIG. 4, a buffer member 82 having a flexibility and a water absorbability is provided between the sliding portion 50a of the slider 50 and the rotor 40. Note that the buffer member 82 will be explained later in detail.

In addition, the electrode substrate 30 has a rotor hole 36 at a center part so that the shaft cylinder 42 of the rotor 40 is rotatably fitted in the rotor hole 36. As shown in FIG. 2B, a plurality of annular electrodes 32 approximately concentric to the rotor hole 36 (shaft hole 44) and having different diameters are formed on a surface of the electrode substrate 30 so that the annular electrodes 32 face the rotor 40. The number of the annular electrodes 32 is same as the number of poles (eight in the present embodiment) of the slip ring 80. In addition, as shown in FIG. 2A, lead-out electrodes 34 corresponding one-to-one to the annular electrodes 32 are formed on the outer surface of the electrode substrate 30. A through hole 38 connecting the annular electrode 32 with the lead-out electrode 34 is formed on the electrode substrate 30. Thus, the annular electrode 32 and the lead-out electrode 34 are conducted with each other via the through hole 38. In addition, the lead-out electrode 34 is led out to the rotor surface side again via a through hole 38' and connected to each terminal of a connector 12.

The rotor 40 is housed in the rotor housing portion 21 of the case portion 20 so as to be freely rotatable and closed with the electrode substrate 30. At this time, the shaft cylinder 42 of the rotor 40 is fitted in the rotor hole 36 of the electrode substrate 30 in a freely rotatable state. Consequently, the rotor 40 is axially supported in the case portion 20 so as to be freely rotatable. At this time, the sliding portion 50a of the slider 50 is pressed toward the corresponding annular electrode 32 by an elastic force of the sliding portion 50a itself and an elastic force of the buffer member 82. Thus, the annular electrode 32 and the slider 50 are contacted and conducted with each other.

Here, the explanation will be made about the buffer member 82 which is a characteristic configuration of the present invention. As described above, the buffer member 82 is provided between the sliding portion 50a of the slider 50 and the rotor 40 of the rotary electronic component and the buffer member 82 has flexibility and a water absorbability. At this time, a contact area between the buffer member 82 and the sliding portion 50a is from a tip portion of the sliding portion 50a to an intermediate portion of the sliding portion 50a.

The sliding portion 50a is energized toward the annular electrode 32 with a proper elastic force by an elastic force of the buffer member 82. Consequently, the vibration of the slider 50 caused by the rotation of the rotor 40 is suppressed. Consequently, the metal fatigue of the slider 50 is reduced and the life time of the rotary electronic component can be the extended. In addition, since the buffer member 82 holds the sliding portion 50a, a lateral vibration (vibration in a radial direction) of the sliding portion 50a is prevented and the abrasion and the metal fatigue of the slider 50 in the lateral direction are reduced. Thus, the derailment of the sliding portion 50a from the annular electrode 32 can be prevented. Consequently, the extended life time and high operation reliability of the rotary electronic component can be achieved.

In addition, the buffer member 82 is configured to be extended exceeding the tip portion of the sliding portion 50a in a longitudinal direction of the sliding portion 50a and the thickness of the buffer member 82 is optimized so that a part of the buffer member 82 is appropriately in contact with the annular electrode 32. In addition, it is preferred that the lubricant such as contact grease without impairing conductivity is impregnated into the buffer member 82. In the above described configuration, since the rotor 40 is rotated while the buffer member 82 and the annular electrode 32 are in contact with each other, the lubricant impregnated into the buffer member 82 is applied to the surface of the annular electrode 32. Consequently, the sliding portion 50*a* can be smoothly slid. In addition, the sliding noise can be suppressed and eccentric abrasion of the sliding portion 50*a* caused by the difference of the rotation direction of the rotor 40 can be reduced. Consequently, the abrasion of the sliding portion 50*a* can be further reduced. Furthermore, since the buffer member 82 is rotated in a state of being in contact with the annular electrode 32, the buffer member 82 functions to wipe the surface of the annular electrode 32. Consequently, waste, dust, dirt and the like on the annular electrode 32 are collected by the buffer member 82. Thus, harmful effect to the sliding portion 50*a* by the foreign substances can be prevented. By the above described configurations, the present invention enables the extended life time and high operation reliability of the rotary electronic component.

Note that the buffer member 82 is formed of a porous material made of a synthetic resin having a flexibility and a water absorbability. If an excessively fragile material is used for the buffer member 82, the buffer member 82 itself may be abraded and collapsed by the abrasion after long-time use. This may cause foreign substances. Accordingly, it is preferred to use the material having a certain strength and density for the buffer member 82. In particular, the material made of a polyurethane, a polyvinyl alcohol or a polyolefin having an average pore diameter of approximately 20 μm to 50 μm, a porosity of approximately 70% to 90% and an apparent density of approximately 0.15 g/cm$^3$ to 0.25 g/cm$^3$ is preferred.

Next, the operation of the slip ring 80 of the present invention will be explained briefly. First, the case portion 20 (electrode substrate 30) side of the slip ring 80 is fixed to the stator side of the device. In addition, the rotor 40 side of the slip ring 80 is connected to the rotor side of the monitor camera or the like via the shaft hole 44. Consequently, the rotor 40 of the slip ring 80 is rotated together with the rotor section of the device. Then, the wiring of the stator side is connected to the connector 12 of the electrode substrate 30. In addition, the wiring of the rotor side is connected to the connector 10 of the rotor 40. Consequently, the wiring of stator side and the wiring of the rotor section are electrically connected with each other via the connector 12, the through hole 38', the lead-out electrode 34, the through hole 38, the annular electrode 32, the slider 50, the cable 52 and the connector 10. When the rotor section is rotated, the rotor 40 of the slip ring 80 is rotated and the sliding portion 50*a* is slid while electrical conduction between the sliding portion 50*a* and the annular electrode 32 is maintained.

At this time, the buffer member 82 energizes the sliding portion 50*a* toward the annular electrode 32 with a proper elastic force and holds the sliding portion 50*a*. Consequently, the vibration of the sliding portion 50*a* is suppressed and the metal fatigue of the slider 50 can be reduced. In addition, the lateral vibration of the sliding portion 50*a* is suppressed and derailment of the sliding portion 50*a* from the annular electrode 32 can be prevented. Furthermore, since the lubricant is impregnated into the buffer member 82 and a part of the buffer member 82 is in contact with the annular electrode 32, the lubricant is applied on the annular electrode 32. Consequently, the sliding portion 50*a* slides smoothly and the abrasion of the contact portion can be further reduced. In addition, the buffer member 82 functions to wipe the surface of the annular electrode 32. Consequently, foreign substances such as dust on the annular electrode 32 are collected. Thus, harmful effect to the contact portion between the annular electrode 32 and the sliding portion 50*a* by the foreign substances can be prevented. As described above, in the slider of the rotary electronic component (slip ring 80) to which the present invention is applied, the metal fatigue and the abrasion are reduced by the support of the buffer member 82. Thus, the extended life time and high operation reliability can be achieved.

As described above, the present invention is not limited to the slip ring 80. The present invention can be also applied to the rotary electronic component having the slider contacted and conducted with the annular electrode. In addition, the present invention can be exploited in a region that does not deviate from the gist of invention.

DESCRIPTION OF THE REFERENCE NUMERALS

20: case portion, 30: electrode substrate, 32: annular electrode, 40: rotor, 50: slider, 50*a*: sliding portion, 80: slip ring (rotary electronic component), 82: buffer member

The invention claimed is:

1. A rotary electronic component, comprising:
a rotor;
a case portion that rotatably houses the rotor;
an electrode substrate having an annular electrode concentric to a rotation axis of the rotor so that the annular electrode faces the rotor;
a slider provided on the rotor so as to be contacted and conducted with the annular electrode, wherein
the slider includes: a sliding portion having an arc shaped portion protruded toward the electrode substrate so as to be contacted and conducted with the annular electrode; a fixing portion fixed to the rotor; and a connection portion connecting the sliding portion with the fixing portion,
the connection portion and the fixing portion are curved toward the electrode substrate in a predetermined angle,
a buffer member having a flexibility and a water absorbability is provided between the sliding portion and the rotor,
a contact area between the buffer member and the sliding portion is from a tip portion of the arc shaped portion of the sliding portion to an intermediate portion of the arc shaped portion of the sliding portion,
the buffer member is longer than the tip portion of the sliding portion,
the buffer member is not provided between the arc shaped portion and the electrode substrate, and
the buffer member energizes the sliding portion to the annular electrode for suppressing a vibration of the slider.

2. The rotary electronic component according to claim 1, wherein
the buffer member is a material selected from a group consisting of a polyurethane, a polyvinyl alcohol and a polyolefin,
an average pore diameter of the material is 20 μm to 50 μm,
a porosity of the material is 70% to 90%, and
an apparent density of the material is 0.15 g/cm$^3$ to 0.25 g/cm$^3$.

3. The rotary electronic component according to claim 1, wherein
   a lubricant is impregnated into the buffer member.

4. The rotary electronic component according to claim 3, wherein
   a part of the buffer member is in contact with the annular electrode, and
   the buffer member is configured to apply the lubricant on the annular electrode and wipe the annular electrode.

* * * * *